United States Patent
Hower et al.

(10) Patent No.: US 7,268,045 B2
(45) Date of Patent: Sep. 11, 2007

(54) N-CHANNEL LDMOS WITH BURIED P-TYPE REGION TO PREVENT PARASITIC BIPOLAR EFFECTS

(75) Inventors: Philip L. Hower, Concord, MA (US); Taylor R. Efland, Richardson, TX (US)

(73) Assignee: Texas Instruments Incorporated, Dallas, TX (US)

(*) Notice: Subject to any disclaimer, the term of this patent is extended or adjusted under 35 U.S.C. 154(b) by 252 days.

(21) Appl. No.: 11/179,857

(22) Filed: Jul. 12, 2005

(65) Prior Publication Data

US 2005/0255655 A1 Nov. 17, 2005

Related U.S. Application Data

(62) Division of application No. 10/036,323, filed on Dec. 31, 2001, now Pat. No. 6,958,515.

(60) Provisional application No. 60/259,322, filed on Dec. 31, 2000.

(51) Int. Cl.
*H01L 21/336* (2006.01)

(52) U.S. Cl. .................. 438/282; 438/40

(58) Field of Classification Search .......... 257/296–304, 257/E29.256–E29.26, 335, 343; 438/204
See application file for complete search history.

(56) References Cited

U.S. PATENT DOCUMENTS

| | | | | |
|---|---|---|---|---|
| 4,922,327 A | | 5/1990 | Mena et al. | |
| 5,374,843 A | * | 12/1994 | Williams et al. | 257/492 |
| 5,386,136 A | * | 1/1995 | Williams et al. | 257/409 |
| 5,485,027 A | * | 1/1996 | Williams et al. | 257/343 |
| 6,137,140 A | | 10/2000 | Efland et al. | |
| 6,150,671 A | | 11/2000 | Harris et al. | |
| 6,194,760 B1 | * | 2/2001 | Lee | 257/328 |
| 6,252,278 B1 | * | 6/2001 | Hsing | 257/335 |
| 6,288,424 B1 | * | 9/2001 | Ludikhuize | 257/335 |
| 6,437,399 B1 | | 8/2002 | Huang | |

* cited by examiner

*Primary Examiner*—Zandra V. Smith
*Assistant Examiner*—Swapneel Chhaya
(74) *Attorney, Agent, or Firm*—Peter K. McLarty; W. James Brady, III; Frederick J. Telecky, Jr.

(57) ABSTRACT

An improved n-channel integrated lateral DMOS (10) in which a buried body region (30), beneath and self-aligned to the source (18) and normal body diffusions, provides a low impedance path for holes emitted at the drain region (16). This greatly reduces secondary electron generation, and accordingly reduces the gain of the parasitic PNP bipolar device. The reduced regeneration in turn raises the critical field value, and hence the safe operating area.

6 Claims, 6 Drawing Sheets

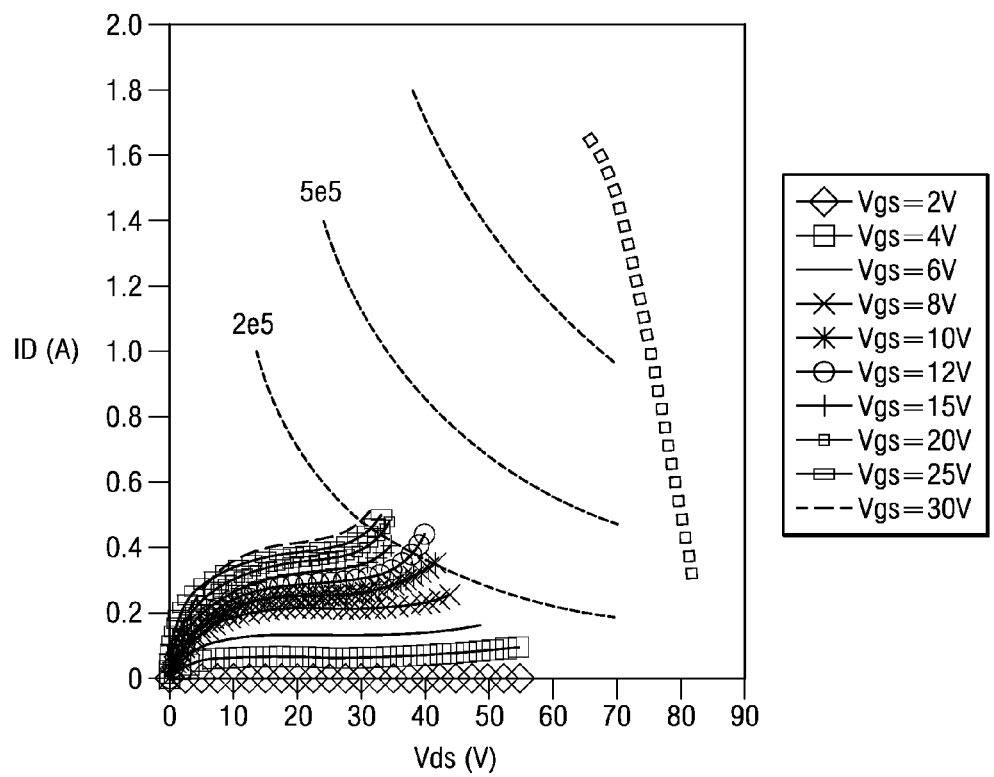
FIG. 2B
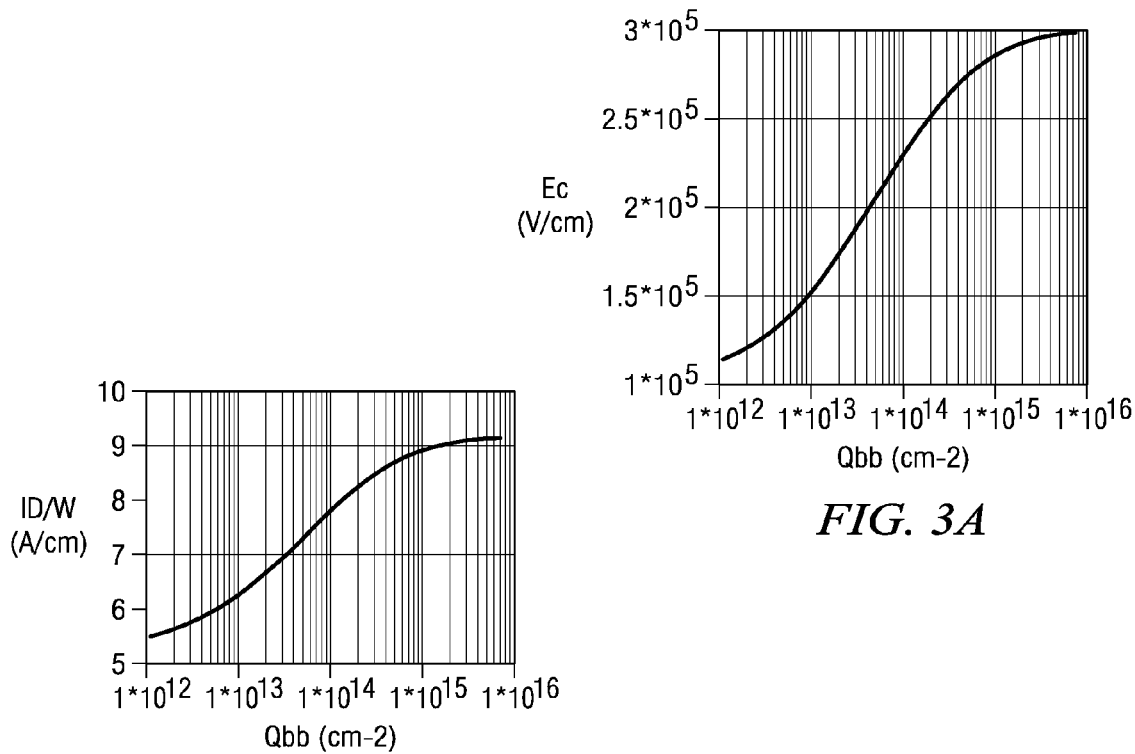
FIG. 3A
FIG. 3B

N-CHANNEL LDMOS WITH BURIED P-TYPE REGION TO PREVENT PARASITIC BIPOLAR EFFECTS

CROSS-REFERENCE TO OTHER APPLICATION

This application is a divisional of application Ser. No. 10/036,323, filed Dec. 31, 2001 now U.S. Pat. No. 6,958,515.

This application claims priority from provisional application 60/259,322 filed Dec. 31, 2000, which is hereby incorporated by reference.

BACKGROUND AND SUMMARY OF THE INVENTION

The present invention relates to integrated circuit structures and fabrication methods, and more particularly to smart power structures which include n-channel lateral DMOS as well as logic transistors.

Background: DMOS and LDMOS

DMOS devices are "double diffused" metal oxide semiconductor (MOS) field effect transistors, or MOSFETs. DMOS are power devices which can be used as individual devices or as components within power integrated circuits. A DMOS is characterized by a source region and a body (or backgate) region which are simultaneously diffused, so that the transistor's channel length is defined by the difference between two diffusion lengths, rather than by separate a patterned dimension. The double-diffusion structure of the DMOS transistor enables a short channel to be formed with high precision. A short channel region provides the ability to control large drain currents by means of the gate voltage. (A drift region separates the short channel from the drain structure, to provide sufficient stand-off voltage capability.) A second advantage is the reduced switching time. That is, DMOS devices have an advantage over other transistor designs through decreasing the length of the channel to provide low-power dissipation and high-speed capability.

DMOS transistors are grouped into vertical DMOS (VDMOS) transistors and lateral DMOS (LDMOS) transistors according to the direction of the current path. An LDMOS has its contacted source and drain regions near at the surface of the semiconductor wafer, and thus, the current traveling across the transistor is more or less lateral in nature.

Background: Secondary Carrier Generation

One of the basic phenomena in power devices is secondary carrier generation: charge carriers can multiply. For example, in an n-channel LDMOS device an electron will often generate additional electron-hole pairs when it enters a region of high electric field (e.g. at the drain boundary). The holes thus created will travel in the opposite direction (since they have opposite charge), and will normally flow back toward the source/channel boundary. The amount of secondary hole current depends on: 1. The magnitude of electric field in the drain depletion layer; and 2. The magnitude of the electron current that is flowing in the channel (the primary current Ich).

Background: Safe Operating Area (SOA)

An important characteristic of LDMOS devices (as of other power transistors) is the "safe operating area" (SOA). The more current a transistor is carrying, the less voltage it can withstand; and the more voltage a transistor must control, the less current it can safely carry. Thus the SOA describes the set of voltage/current values where safe operation is possible. More precisely, if we look at the plot of drain current Id versus drain-source voltage Vds, the SOA describes the range of values within which it is possible to operate the device without damage or destruction. Because temperature plays a role in determining the SOA, the SOA boundary is necessarily a function of pulse duration, with longer pulses having a reduced SOA.

A transistor loaded only by a pure resistance will have only one line of voltage/current values for a given gate voltage, but in real-world applications the operating point can also be affected by the load's reactive and/or hysteretic characteristics. Thus movement within the SOA occurs as the LDMOS interacts with the circuit, and there is a risk that switching transients can lead to current/voltage trajectories that cross the boundary of the SOA. When this boundary is crossed, negative resistance occurs and "snapback" of the current-voltage characteristic can take place, i.e. The transistor may start to conduct very large currents. A transistor in this state is likely to destroy itself or its power supply connections.

Thermal effects are also involved: when a transistor is operating under high current and high bias, heat will be generated. Because physical behavior responsible for initiating snapback is a function of temperature, it is important to keep track of ambient temperature and pulse conditions so that the device junction temperature can be determined. Thus caution is needed in specifying SOA at room temperature, since the worst-case conditions occur when the device is hot.

SOA performance is a particular problem for N-channel Ldmos transistors. Such transistors are generally used as IC output drivers, because the Rsp vs. BVdss tradeoff is more favorable than for a p-channel Ldmos, In addition, circuit topologies tend to favor an n-Ldmos in these and other power applications. However, a drawback of the n-Ldmos is that its safe operating area is generally inferior to that of a p-Ldmos.

Background: Parasitic Bipolar

Many semiconductor devices can operate in more than one way, and the undesired modes of operation are referred to as "parasitic" modes or devices. In an n-channel LDMOS, the n-type source, p-type body (and drift region), and n-type drain define a parasitic NPN bipolar transistor, which plays an important part in limiting the SOA. The negative resistance and snapback behavior are due to the presence of this parasitic bipolar transistor (which is unavoidably present in all LDMOS transistors). The bipolar emitter, base, and collector regions of the parasitic bipolar are equivalent to the source, body (or backgate), and drain regions of the LDMOS. At high currents and high voltages, the parasitic bipolar transistor can be turned on by carriers (holes) created by impact ionization in the drain region of the LDMOS. The typical LDMOS base region has a fairly high sheet resistance, so high currents can create enough base-emitter voltage drop to turn on the parasitic bipolar. Once the parasitic bipolar turns on, continued generation of secondary holes at the drain side will keep the bipolar on until the device is destroyed (or current is otherwise limited).

Some generation of secondary holes occurs under many operating conditions. However, the danger is in uncontrolled current, i.e. in the negative resistance condition mentioned above. When the secondary hole current turns on the parasitic NPN device, this device begins to provide a secondary electron current. If the ratio of secondary electrons per secondary hole times the ratio of secondary holes per electron exceeds one, the secondary electron current and secondary hole current are in a positive feedback relationship, and the device is no longer controlled by the gate.

Impact ionization is the process where a carrier drifting under a high electric field (say an electron at the drain side of an n-LDMOS) generates another pair of carriers. The lower SOA of n-LDMOS (as compared p-LDMOS) is mainly due to the larger value of the impact ionization coefficient of electrons versus holes. If we use critical field Ec as a gauge of the propensity to electrical snapback, the difference in impact ionization coefficients can lead to critical fields of only 1.5e5 V/cm for an n-Ldmos, as opposed to 3e5 V/cm for a p-Ldmos. This factor of two difference in critical field corresponds to a factor of FOUR difference in power density, so it can be seen that the limited SOA of n-channel LDMOS devices is a very significant limitation.

LDMOS with Improved Safe Operating Area

The present application discloses n-type LDMOS devices in which a low resistance shunt path is provided for the holes that are generated in the drain region due to impact ionization. As seen in FIG. 1, a heavily-doped p-type "buried body" region is placed beneath the source and p-type body, preferably using an implantation through the same mask window as the source and body dopants. This buried body region provides a low-impedance path which collects a large fraction of the secondary hole current, so that these holes do not forward bias the base-emitter junction of the parasitic npn bipolar.

This structure has been shown to make the overall propensity to snapback much lower, and with sufficient dosage in the buried body the critical field can be increased to nearly the bulk breakdown value.

The results found with this structure are surprisingly different from those found with high-energy retrograde wells: the results reported with high-energy retrograde wells did not show any major improvement over that for more conventional Ldmos.

The disclosed structure not only collects secondary holes efficiently, but also reduces the base resistance and hence the base-emitter voltage drop. (If the base-emitter voltage drop is less than one diode drop, or approximately one volt, the parasitic bipolar device cannot turn on.)

Advantages of the disclosed methods and structures, in various embodiments, can include one or more of the following:

Higher critical field;
Larger safe operating area for n-channel LDMOS devices;
Reduced susceptibility to voltage transients;
Increased reliability of smart-power devices;
Simple fabrication (no increased mask count);
Increased power handling for a given chip area.

BRIEF DESCRIPTION OF THE DRAWINGS

The disclosed inventions will be described with reference to the accompanying drawings, which show important sample embodiments of the invention and which are incorporated in the specification hereof by reference, wherein:

FIG. 2B is a graph illustrating the safe operating area of a prior art LDMOS which lacks the proposed invention but is otherwise the same.

FIG. 3A shows the relation between critical field and buried body dose for an n-Ldmos constructed as in FIG. 1. Note that the critical field, at large buried body doses, is approaching the limiting value characteristic of bulk material.

FIG. 3B correspondingly shows how the drain current per unit gate width is advantageously increased in dependence on the buried body dose.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Figure 1:
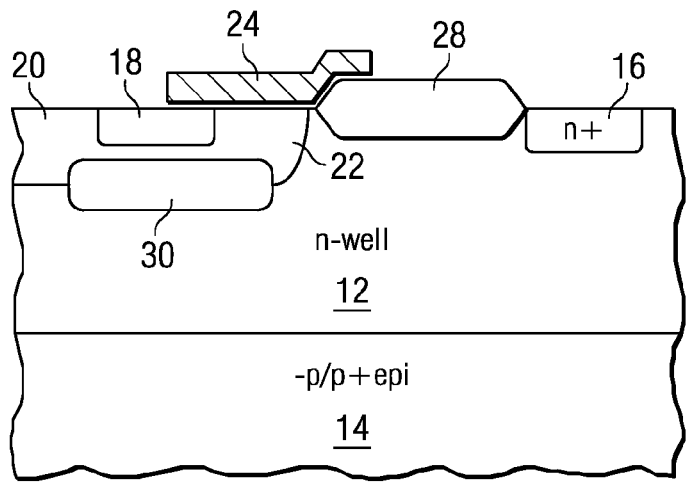
FIG. 1 is a conceptual cross-section of a sample embodiment of the inventive LDMOS transistor.

FIG. 1 is a conceptual cross-section of a sample embodiment of the inventive LDMOS transistor. (This embodiment is an n-channel LDMOS transistor—since n-channel is particularly advantageous due to the difference in impact ionization coefficients mentioned above—but the disclosed principles can also be adapted, less advantageously, to a p-channel device.) The transistor 10 is formed in a semiconductor starting structure 14 with the drain region 16 located in a N well region 12 and the source region 18 located in D-well 20. The semiconductor substrate 14 can be formed from a p-epitaxial layer formed over p+ substrate as is common in the art. An n type dopant, such as phosphorus, can compensate the p+ sub/p-epitaxial substrate 14 to form lightly doped N well 12, which is also part of the drain of DMOS transistor 10. The D well 20 defines a channel region 22 of a first conductivity type between the outer edges of the D-well 20 and source region 18.

The source region 18 is of a second conductivity type, commonly an n+ type material, opposite the first region, or the N well 12. And the drain region 16, which can be of the same second conductivity type of the source region 18, or of a different n+ type material, is adjacent the channel region 22.

A gate 24 covers at least a portion of the channel region 22, and extends from the source region 18 proximate to the drain region 16. The gate 24 is comprised of materials common in the art, such as polysilicon. The gate 24 is also extended over field oxide region 28 and gate oxide region 26, to provide a field plate for the high-voltage device. The gate 24 controls the current from the drain region 16 to the source region 18 and can achieve either a logical on state or off state depending on the specific design of the LDMOS.

The lateral DMOS 10 further includes a conductive body region 30 deep in the D well 20 and proximate to the source region 18, preferably being underneath the source region 18. The conductive body region 30 can be implanted into the D well 20, and possibly the N well 12, with a high energy (MeV) implanter. (Optionally this can be done with an angle implant, so that the conductive body 30 extends further under the gate).

Alternatively, the conductive body region 30 can be formed during epitaxial growth of the semiconductor layer. If the conductive body region 30 were formed as part of the epitaxial layer growth process, the body region 30 would be formed after the growth of the second layer, and a third epitaxial layer would be grown to provide the material for the source, drain, and surface body diffusions. The conductive body region 30 is preferably comprised of p-type material, which can be the same material as that constituting the D well 20. During high-voltage high-current operation of the LDMOS 10, the high field region at the drain region 16 acts as an emitter of holes and the conductive p-body region 30 acts as a collector of the holes to prevent the onset of negative resistance in the LDMOS transistor 10. The inclusion of the conductive body region 30 thus provides a low impedance path for the holes which avoids forward biasing the body-source junction, and accordingly improving the maximum drain current ($I_D$) and safe operating area of the LDMOS 10.

An LDMOS 10 was constructed with the conductive body region 30 comprised of a body implant of approximately 3e14 cm2. The mean depth of the body was about 1 micron from the surface of the LDMOS. As stated above, a high energy (MeV) implanter can be used to implant a conductive body to form the conductive body region 30, or alternately, the body region 30 can be formed early in the process during the epitaxial growth step. High-energy implantation is the preferred method and was used for the experimental LDMOS, which had two epitaxial layers. The experimental LDMOS was otherwise identical to the existing of 60 V rated LDMOS of Texas Instruments, which normally has a drain-source breakdown voltage (BVdss) of about 70 V. For a representative LDMOS of 6.75e-5 cm2 area, and gate width W of 938 microns, the maximum drain current IDsoa at Vds=70 V is 1.6 A or 2.37e4 A/cm2 and 17 A per cm of gate width. The existing LDMOS without a conductive body region 30 is limited by the critical field for electrons (Ecn) of about 1 to 1.2e5 V/cm. With the inclusion of the conductive body region 30, better body shorting occurs which effectively increases the Ecn to about 3e5 V/cm. Because the safe operating area power density is dependent on Ecn squared, a factor of 3 in improvement of Ecn will yield almost an order of magnitude improvement in safe operating area power density.

Figure 2A:
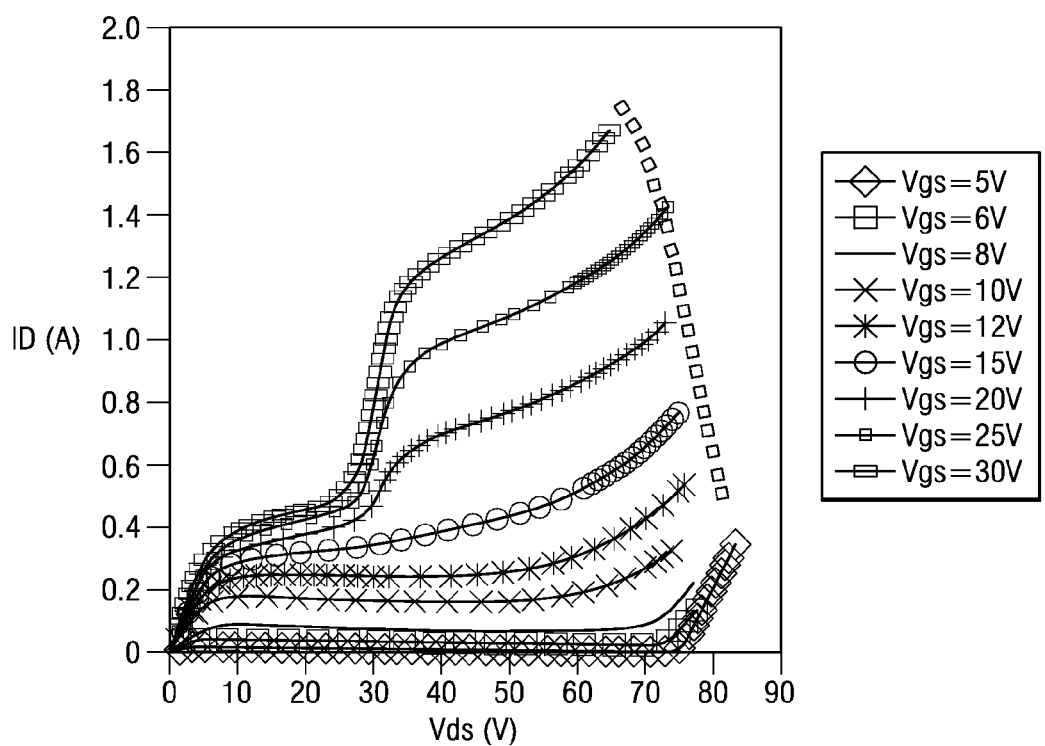
FIG. 2A is a graph illustrating the safe operating area of an exemplary embodiment of the present inventive LDMOS.

FIG. 2A is a graph illustrating the improvement effected by the inclusion of the conductive body region 30 in the existing Texas Instruments 60V LDMOS. FIG. 2A is a plot of measured drain current vs. drain-source voltage for fixed values of gate-source voltage, measured on the wafer using probes. This type of display is commonly called the drain characteristic. For each Vgs, Vds is increased until snapback occurs. Since this is a destructive measurement, a new site on the wafer is chosen for the next value of Vgs. In this way the entire drain characteristic can be measured and at the same time, the Safe Operating Area is determined.

FIG. 2B is a graph similar to FIG. 2A, but in this case the wafer was processed without including the conductive body region 30. The scales are the same as in FIG. 2A, and it can be seen that the Safe Operating Area is much smaller in size. FIG. 3 shows lines of constant power density. The LDMOS without the conductive body region is limited to approximately 2e5 W/cm2 where as with the conductive body, the power density increases to more than 1e6 W/cm2, a substantial improvement.

The present invention further provides a method for fabricating a lateral DMOS transistor 10 having a conductive body region 30. The method includes forming a first region, such as D well 20, of a first conductivity type on a semiconductor layer, such as N well 12 and P+ sub/P-EPI layer 14, and then the step of forming a source region of a second conductivity type, such as n+ source region 18, opposite the first region. The source region 18 is preferably formed such that the body 30 is below the source region 18. Then the method includes the step of forming a channel region 22 between an edge of the source region 18 and an edge of the first region (D well 20) occurs, followed by forming a drain region 16 of a second conductivity type in the semiconductor layer, such as N well 12, where the drain region 16 is adjacent the channel region 22. The method then includes the step of forming at least one gate 24 extending over at least a portion of the channel region 22. The steps of the method can be varied in accord with the constraints of the semiconductor fabrication process as is known in the art.

The method preferably further includes the steps of forming one or more field oxide regions 28 on the first region, and forming a gate oxide region 26 on the first region, the channel region 22, and the source region 18, such that the step of forming at least one gate 24 extending over at least a portion of the channel region 22 is forming at least one gate 24 upon the gate oxide region 26 and field oxide region 28 region. The step of forming a conductive body region 30 in the first region (D well 20) is forming a deep conductive body region 30 of the first conductivity type in the first region 20. Further, the step of forming a conductive body region 30 in the first region can be implanting a conductive body region 30 into the first region with a high-energy implanter. Alternately, the step of forming a conductive body region 30 in the first region is forming a conductive body region 30 as an epitaxial layer on the semiconductor layer.

FIG. 2A is a graph illustrating the safe operating area of an exemplary embodiment of the present inventive LDMOS, and FIG. 2B is a graph illustrating the safe operating area of a prior art LDMOS which lacks the proposed invention but is otherwise the same.

FIG. 3A shows the relation between critical field and buried body dose for an n-Ldmos constructed as in FIG. 1. Note that the critical field, at large buried body doses, is approaching the limiting value characteristic of bulk material.

FIG. 3B correspondingly shows how the drain current per unit gate width is advantageously increased in dependence on the buried body dose.

FIGS. 4A-4H show a sample process flow in greater detail. In this example, the starting material 14B is 20 microns of p-type epitaxial silicon on a <100> oriented p+ silicon substrate.

A first oxidation step then forms 750 nm of oxide overall. A hard mask is deposited, patterned, and etched to expose desired locations of the n+ buried layer to an antimony implant (3 to 6e15 per square cm, in this example). After a diffusion step to form the n+ buried layer, the surface oxide is stripped. These steps are not shown in the sequence starting with FIG. 4A, since this sequence shows a low-side driver device, and the n+ buried layer, as shown e.g. in FIG. 5B, is used for high-side driver devices. (A low-side driver is a transistor (or other device) which controllably pulls an output terminal down towards ground, whereas a high-side driver is one which controllably pulls the output up towards a positive voltage.)

An epitaxial layer 14B is grown, e.g. 9 to 10 microns of silicon, doped p-type to a conductivity of about 7 ohm-cm.

A second oxidation then forms another 750 nm of oxide 402A overall, and a photoresist layer 401A is patterned to expose the N-well locations to an implant (3 to 5e12 of phosphorus in this example). This is the step shown in FIG. 4A.

The implanted dopant is then driven to produce a junction depth $x_j$ of 4 to 6 microns (within the p-type epitaxial layer 14A). The desired locations of the n+ sinker diffusions are then patterned, etched, and POCl$_3$-doped. (Sinker diffusions provide contact to buried layers, and are also often used for lateral isolation of power devices.) After an oxide strip a pad oxide is grown (e.g. 35 nm), and the CMOS N- and P-well dopants are implanted (in other locations, not shown).

Figure 4A:
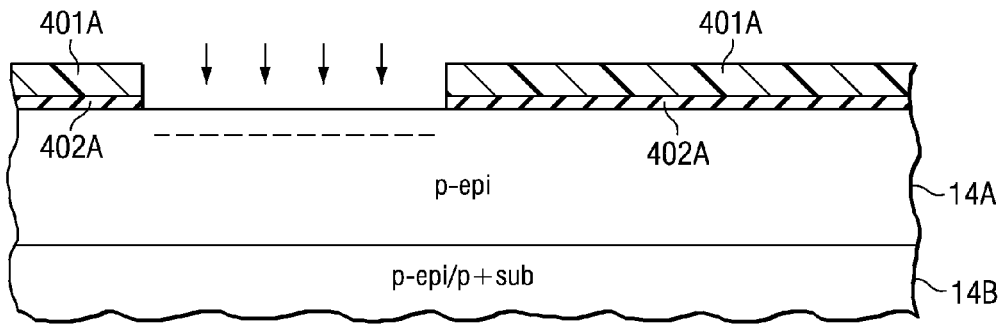
FIGS. 4A-4H show details of a sample process flow.
Figure 4B:
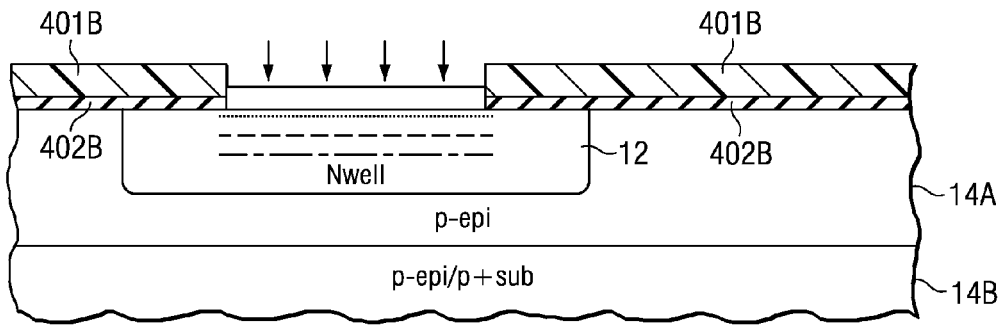
Figure 4C:
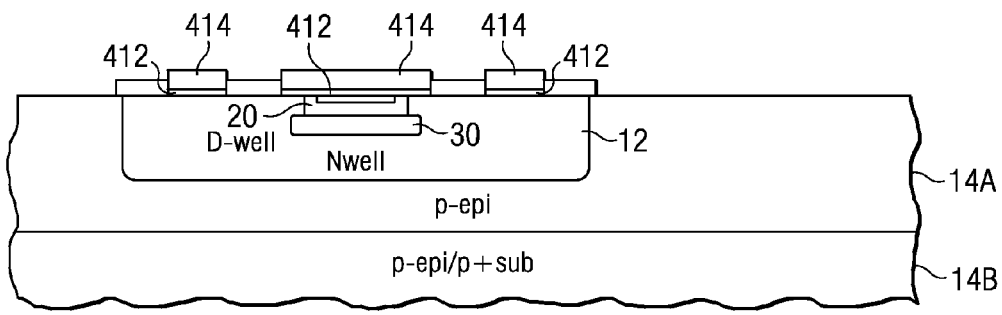
Figure 4D:
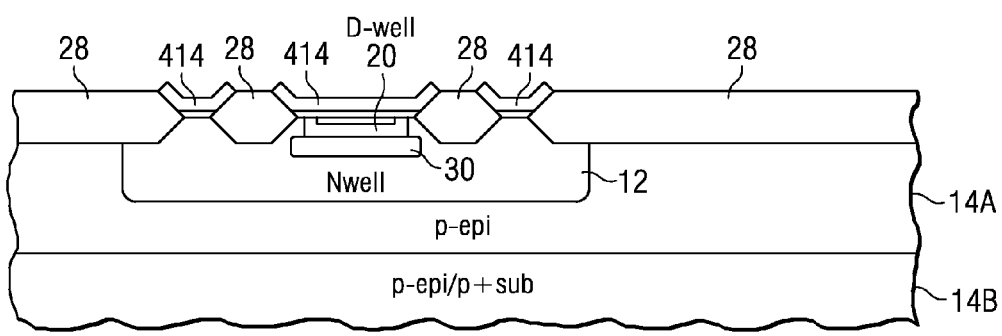
Figure 4E:
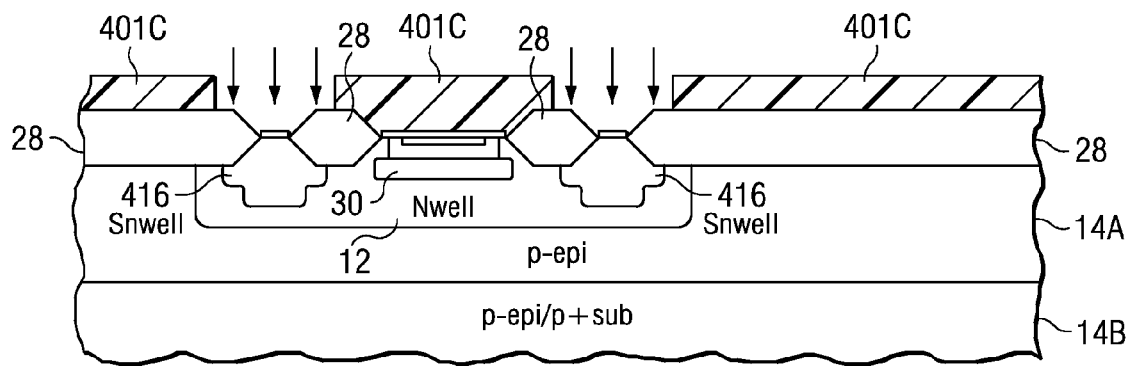
Figure 4F:
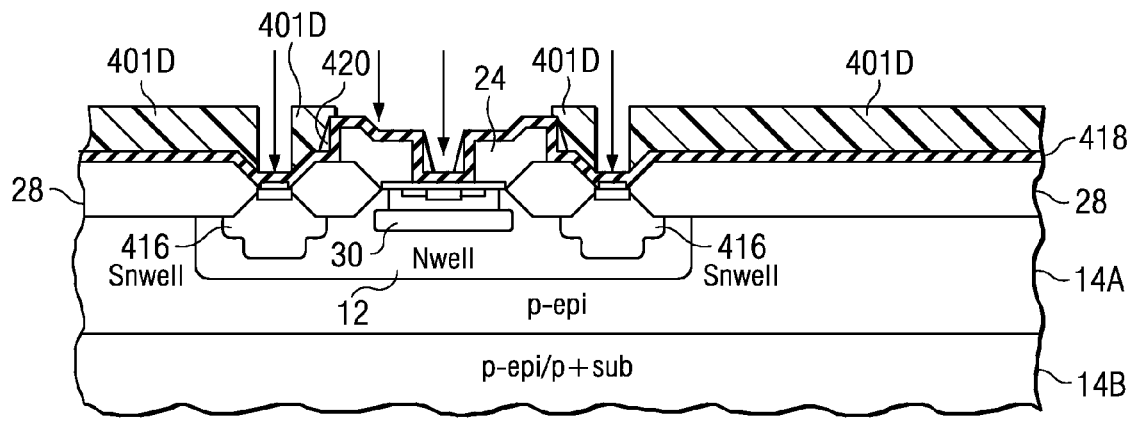
Figure 4G:
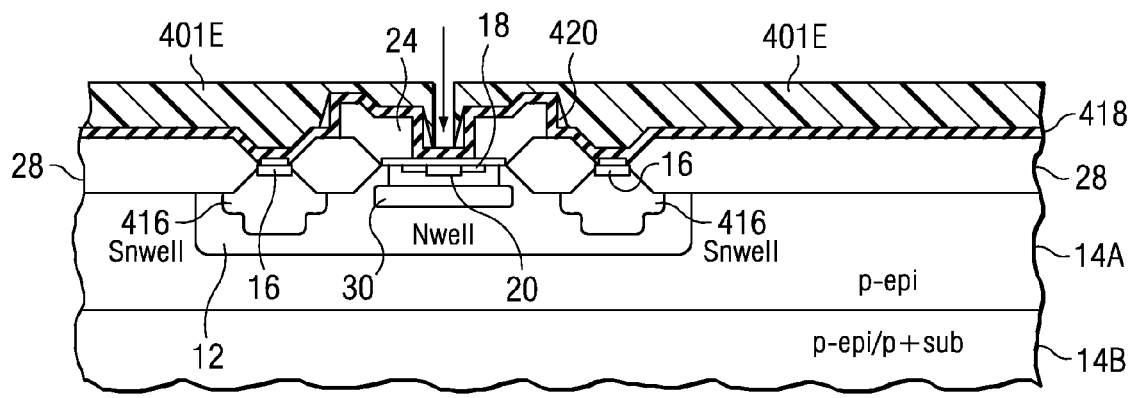

Photoresist layer 401B and hardmask layer 402B are then patterned and etched to expose the desired D-well (p-body) locations. As shown in FIG. 4B, a triple implant is now performed, e.g.:

1 to 4e14 per square cm of boron at an energy of 300 to 600 keV (buried body);
3 to 7e13 per square cm of boron at an energy of 50 keV (surface body);
3 to 8e13 per square cm of Arsenic at an energy of 135 keV (source).

The order of these implants is not particularly critical, but in this embodiment all three are self-aligned to each other, i.e. they are all preferably implanted through the same mask window.

Next a diffusion step is performed to achieve a junction depth xj=2 to 2.5 microns (i.e. The junction to the N-well beneath the buried body 30). Oxide is then stripped, and a pad oxide 412 grown.

Photoresist is then deposited and patterned for a base implant (not shown), used in other parts of the device.

Silicon nitride 414 is then deposited to 100-150 nm thick, and patterned to expose desired LOCOS oxide locations. This results in the structure shown in FIG. 4C.

Field oxidation is now performed to grow LOCOS oxide regions 28 to (in this embodiment) 600-700 nm thick. This results in the structure shown in FIG. 4D.

The LOCOS nitride 414 is now stripped, a sacrificial oxidation step is performed to improve surface quality (e.g. 30 nm oxide growth followed by 80 nm etchback), and a gate oxide is grown to e.g. 30-40 nm thickness.

Threshold adjust patterning and implanting is now performed (not shown in these figures), and then photoresist layer 401C is patterned to expose desired drain regions. An "SNwell" implant is now performed into these regions (and elsewhere), e.g. with 3 to 6e13 per square cm of phosphorus at 800 to 900 keV. This results in the structure shown in FIG. 4E.

Photoresist layer 401C is now stripped, and an RTA (Rapid Thermal Anneal) step is performed to activate the Snwell implant.

A gate layer 24 is now formed (e.g. 500 nm of n+ polysilicon is deposited, patterned and etched. A cap oxide 418 is deposited overall (e.g. 35 nm of TEOS oxide).

After the nLDD and pLDD patterning and implants (used in the low-voltage CMOS circuitry, not shown), sidewall spacers 420 are formed, e.g. by conformally depositing (and anisotropically etching back) 120 to 160 nm of silicon nitride overall.

Photoresist layer 401D is now patterned to expose desired locations to the source/drain implant, e.g. 2 to 6e14 per square cm of phosphorus plus 2 to 4e15 per square cm of arsenic. Note that the spacers 420 self-align this implant to the gate layer 24, in the source contact region, for minimal source series resistance. This produces the structure of FIG. 4F.

Resist is now stripped, and photoresist layer 401E is now formed and patterned to expose only the center of the source contact locations. A p+ source/drain implant is now performed, e.g. 1.5 to 3e15 per square cm of boron. This produces the structure of FIG. 4G.

Resist is then stripped, and contact formation proceeds. In this embodiment, and a BPSG/undoped silicate glass stack is then formed (e.g. 600 to 900 nm thick) and densified. Contacts are patterned and etched, and platinum is deposited overall and sintered (to produce platinum silicide cladding on contact surfaces).

Figure 4H:
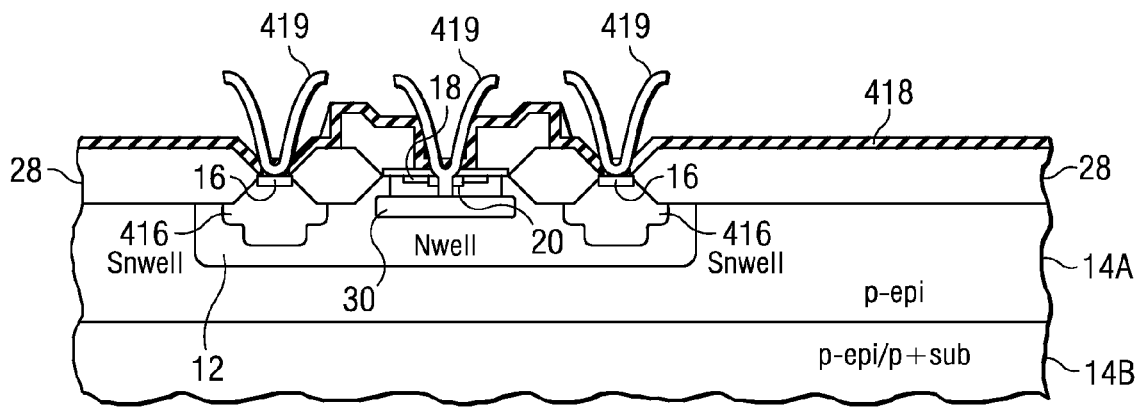

Metallization 419 (e.g. 500 to 800 nm of Al/Si/TiW stack) is then deposited, patterned and etched. As shown in FIG. 4H, the metallization structure 419 connects the source 18 with the buried body 30. This produces the device structure of FIG. 4H. Processing is then completed with conventional steps for further metallization if desired, encapsulation, contact pad exposure, etc.

Figure 5A:
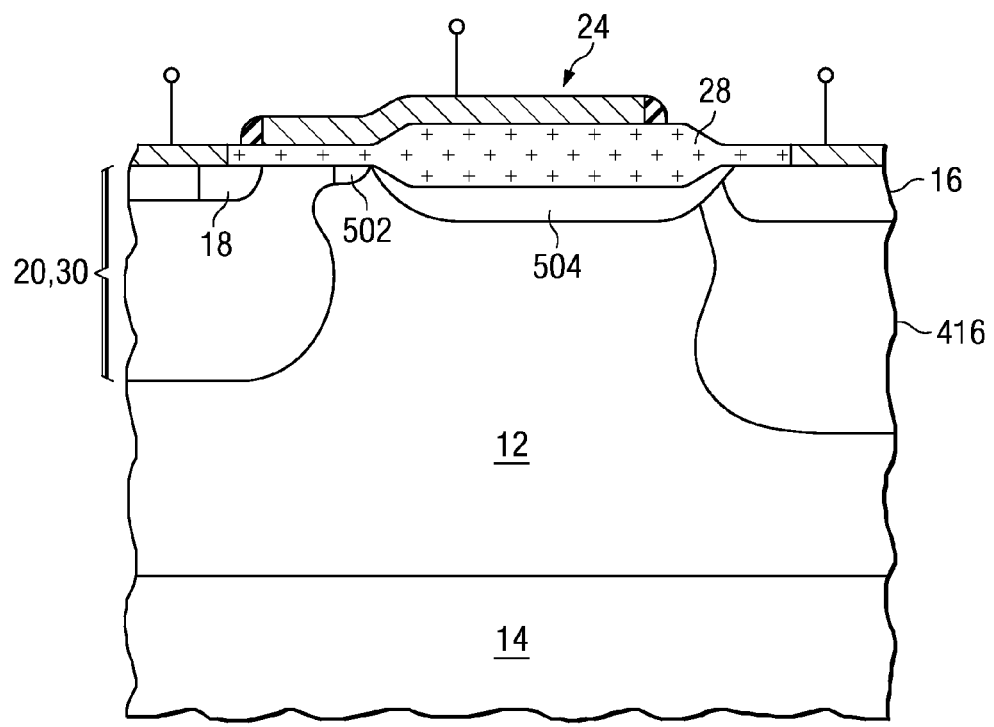
FIGS. 5A through 5C are a set of device cross-sections, showing how the device dimensions are scaled for different operating voltage specifications.
Figure 5B:
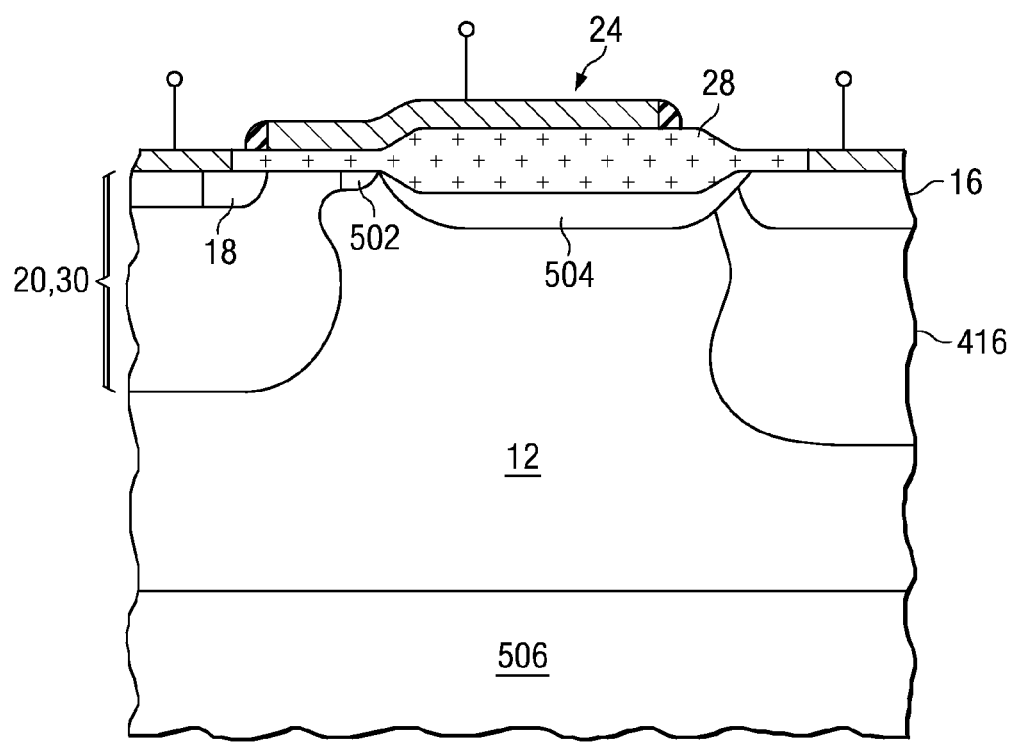
Figure 5C:
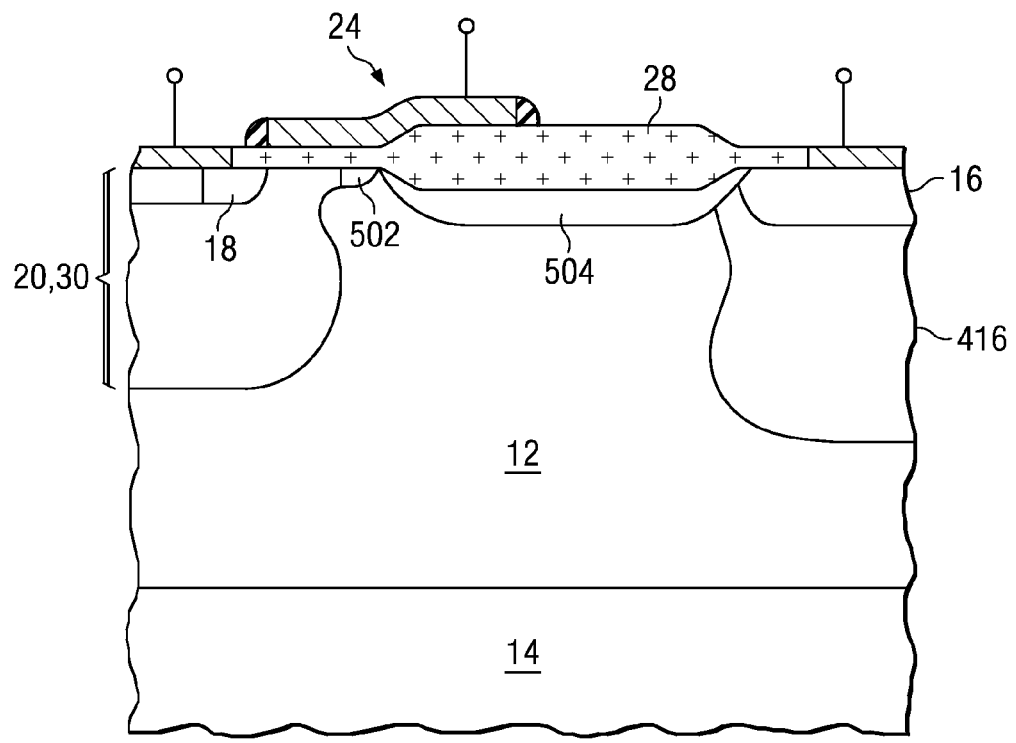

FIGS. 5A through 5C are a set of device cross-sections, showing how the device dimensions are scaled for different operating voltage specifications. However, note that the drift region length will scale with voltage (approximately one micron for each 25V), and this increase in length has not been shown.

FIG. 5A shows simulated diffusion contours in a sample embodiment designed for 60V low-side operation. Note that this figure shows the presence of the threshold-adjust diffusion 502 in the channel, as well as the presence of additional conductivity-adjust doping 504 in the drift region. Note also that the Snwell diffusion 416 surrounds the n+ drain 16, and thus provides some reduction in electric field at the drain boundary. In this figure the shallow body 20 and buried body 30 are shown together as a single diffusion with a complex shape.

FIG. 5B shows diffusion contours in a sample embodiment designed for 50V high-side operation. Note that this figure shows the n-type buried layer 506 under the well 12.

FIG. 5C shows diffusion contours in a sample embodiment designed for 25V low-side operation. Comparison of this Figure with FIG. 5A will show some of the ways in which device parameters are scaled: note, for example, that the space between the shallow n-well diffusion 416 and the bottom of the well 12 is greater in the 25V embodiment than in the 60V embodiment. Note also that the buried body diffusion 30 extends farther out laterally (below the VT-adjusted channel portion 502). Other scalable parameters are of course well known to those of ordinary skill.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

Similarly, it will be readily recognized that the described process steps can also be embedded into other hybrid process flows, e.g. including other analog, optoelectronic, logic or power devices in addition to LDMOS.

Note that the self-aligned relation of the source, body, and buried body, in the presently preferred embodiment, can be preserved even though offsets are introduced. For instance, by performing only some of these three implants with a sidewall filament on the edge of the mask stack, the implant apertures can be given different widths while still preserving a self-aligned relationship.

Note also that more or fewer epitaxial growth steps can be performed, and more buried layers and/or sinker diffusions can be used, depending on the needs of the particular process implementation.

Only one gate level is shown, but in a smart power process other thin film conductor layers would normally be present. Again, a huge range of modifications are possible, as determined by the needs of the particular process.

In another contemplated alternative embodiment, the buried body implant can be an angled implant (e.g. while the source and normal body implants are straight-in perpendicular implants).

In another contemplated alternative embodiment, the buried body can be formed as a buried layer beneath a third epitaxial layer. This provides additional flexibility to vary the vertical dopant profile.

Also the buried implant can be spaced according to a dimension from (e.g.) The surface well definition mask, either as either a contained pattern or as overlapping. In this case the buried well can be a separate implant with a different dimension than the surface implant; this alternative adds process complexity, but can be used to help with subsurface breakdown voltage issues. In this case the surface body would be self aligned to the source, while the buried body component would not.

In a further class of alternative embodiments, the preferred source cell (preferably a photo aligned dual p-type implant with a coimplanted n-type to form a triple implanted self aligned DMOS body) can be used as the source cell for vertical DMOS device structures.

In a further class of alternative embodiments, the preferred source cell can be used in combination with a trench device (e.g. of VMOS type).

In a further class of alternative embodiments, the preferred device can be used on a DI/SOI wafer (i.e. where the semiconductor active device regions overlie a dielectric layer, and are fully surrounded by dielectric isolation).

In a further class of alternative embodiments, the geometry of the buried body, and/or of the surface body can be modified in other ways, e.g. so that the buried body is not self-aligned to the surface body, as long as the buried body diffusion is present beneath (or approximately beneath) the channel, to provide a junctionless low-impedance bypass for collecting holes from the drift region.

Similarly, a variety of geometries can be used for lateral confinement, and other techniques can be used to make a low-resistance ohmic connection to the buried body. (Ohmic contact to the body is common, but the low-resistance path to the buried body is preferably implemented with a different structure.)

In a further class of alternative embodiments, poly alignment instead of photo alignment can be used to implement the alignment relations described above.

The teachings above are not necessarily strictly limited to silicon. In alternative embodiments, it is contemplated that these teachings can also be applied to structures and methods using other semiconductors, such as silicon/germanium, silicon/germanium/carbide, and related alloys, gallium arsenide and related compounds and alloys, indium phosphide and related compounds and alloys, silicon carbide, diamond, and other semiconductors, including layered heterogeneous structures.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

What is claimed is:

1. A method for fabricating a lateral DMOS transistor, comprising:
   forming a first region of a first conductivity type on a semiconductor layer;
   forming a buried body region in the first region;
   forming a source region of a second conductivity type opposite the first region, the source region formed such that the body is proximate the source region, and wherein a channel region is formed between an edge of the source region and an edge of the first region;
   forming a drain region of a second conductivity type in the semiconductor layer, the drain region adjacent the channel region; and
   forming at least one gate extending over at least a portion of the channel region.

2. The method of claim 1, wherein said action of forming a conductive body region in the first region is forming a conductive body region of the first conductivity type in the first region.

3. The method of claim 1, wherein said action of forming a conductive body region in the first region is implanting a conductive body region into the first region with a high energy implanter.

4. The method of claim 1, wherein said action of forming a conductive body region in the first region is forming a conductive body region between epitaxial layer growth steps.

5. The method of claim 1, further including the steps of:
   forming one or more field oxide regions on the semiconductor layer; and
   forming a gate oxide region on the first region, the channel region, and the source region,
   wherein the step of forming at least one gate extending over at least a portion of the channel region is forming at least one gate upon the gate oxide region and a field oxide region.

6. A product produced by the method of claim 1.

* * * * *